(12) United States Patent
Kim et al.

(10) Patent No.: US 9,930,770 B2
(45) Date of Patent: *Mar. 27, 2018

(54) PRINTED CIRCUIT BOARD, DISPLAY APPARATUS HAVING A PRINTED CIRCUIT BOARD AND METHOD OF MANUFACTURING THE PRINTED CIRCUIT BOARD

(71) Applicant: Samsung Display Co., Ltd., Yongin-Si, Gyeonggi-Do (KR)

(72) Inventors: Kwan-Ho Kim, Cheonan-si (KR); Ick-Kyu Jang, Seoul (KR); Ji-Man Myeong, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/296,434

(22) Filed: Oct. 18, 2016

(65) Prior Publication Data
US 2017/0042020 A1   Feb. 9, 2017

Related U.S. Application Data

(63) Continuation of application No. 13/556,274, filed on Jul. 24, 2012, now abandoned, which is a (Continued)

(30) Foreign Application Priority Data

Sep. 11, 2007 (KR) .................. 10-2007-0091958

(51) Int. Cl.
*H05K 1/02* (2006.01)
*H05K 9/00* (2006.01)
*G09G 3/36* (2006.01)

(52) U.S. Cl.
CPC ......... *H05K 1/0219* (2013.01); *G09G 3/3696* (2013.01); *H05K 1/0218* (2013.01); (Continued)

(58) Field of Classification Search
CPC .. H05K 1/0218; H05K 1/0219; H05K 1/0237; H05K 1/0298; H05K 2201/0715; (Continued)

(56) References Cited

U.S. PATENT DOCUMENTS 4,685,033 A    8/1987  Inoue
5,003,273 A *  3/1991  Oppenberg ............ H01P 3/088
                                              174/117 FF
(Continued)

FOREIGN PATENT DOCUMENTS

EP    1684558 A2   7/2006
JP    10041637 A   2/1998
(Continued)

OTHER PUBLICATIONS

Extended European Search Report for Application No. 08006205.2 dated Dec. 29, 2009.

*Primary Examiner* — Hoa C Nguyen
(74) *Attorney, Agent, or Firm* — Cantor Colburn LLP

(57) ABSTRACT

A printed circuit board ("PCB") includes a first pattern structure, a second pattern structure, a third pattern structure, and a fourth pattern structure. The first pattern structure includes a first ground pattern. The second pattern structure includes a first line pattern overlapping the first ground pattern and a second ground pattern electrically insulated from the first line pattern. The third pattern structure includes a third ground pattern overlapping the first line pattern and a second line pattern overlapping the second ground pattern. The fourth pattern structure includes a fourth (Continued)

ground pattern overlapping the second line pattern. Therefore, the PCB may decrease noise.

8 Claims, 9 Drawing Sheets

Related U.S. Application Data continuation of application No. 12/204,015, filed on Sep. 4, 2008, now Pat. No. 8,254,136.

(52) U.S. Cl.
CPC ....... *H05K 1/0237* (2013.01); *G09G 2330/06* (2013.01); *H05K 1/0298* (2013.01); *H05K 2201/0715* (2013.01); *H05K 2201/09236* (2013.01); *H05K 2201/09336* (2013.01); *H05K 2201/09672* (2013.01); *Y10T 29/49124* (2015.01); *Y10T 29/49126* (2015.01); *Y10T 29/49144* (2015.01); *Y10T 29/49156* (2015.01)

(58) Field of Classification Search
CPC .......... H05K 2201/09236; H05K 2201/09336; H05K 2201/09672; G09G 3/3696
USPC .................................. 361/816, 818
See application file for complete search history.

(56) References Cited

U.S. PATENT DOCUMENTS

| | | | |
|---|---|---|---|
| 5,165,055 A | 11/1992 | Metsler | |
| 5,633,479 A | 5/1997 | Hirano | |
| 5,737,272 A | 4/1998 | Uchiyama et al. | |
| 5,966,294 A | 10/1999 | Harada et al. | |
| 6,246,112 B1 | 6/2001 | Ball et al. | |
| 6,329,604 B1 | 12/2001 | Koya | |
| 6,359,237 B1 | 3/2002 | Tohya et al. | |
| 6,388,205 B1 | 5/2002 | Chua | |
| 6,420,778 B1 | 7/2002 | Sinyansky | |
| 6,573,600 B2 | 6/2003 | Kikuchi et al. | |
| 6,614,325 B1 | 9/2003 | Kocin | |
| 6,838,314 B2 | 1/2005 | Chang | |
| 6,903,700 B2 | 6/2005 | Maruhashi et al. | |
| 7,129,416 B1 | 10/2006 | Steinfeld et al. | |
| 7,207,104 B1 | 4/2007 | Steinfeld et al. | |
| 7,268,645 B2 | 9/2007 | Meltzer et al. | |
| 8,134,084 B2 | 3/2012 | Kawaguchi et al. | |
| 8,288,658 B2 * | 10/2012 | Uchida | B62D 5/0406 174/252 |
| 9,338,931 B2 * | 5/2016 | Pierson | H05K 1/0224 |
| 2002/0060366 A1 * | 5/2002 | Kikuchi | H01L 23/13 257/776 |
| 2003/0075349 A1 | 4/2003 | Kruse et al. | |
| 2003/0206160 A1 | 11/2003 | Ikami | |
| 2006/0290831 A1 * | 12/2006 | You | G02F 1/133514 349/56 |
| 2007/0120780 A1 * | 5/2007 | Park | G09G 3/3291 345/76 |
| 2007/0222052 A1 | 9/2007 | Kabumoto | |
| 2007/0263370 A1 | 11/2007 | Niki | |
| 2007/0284140 A1 | 12/2007 | Danoski et al. | |
| 2008/0049410 A1 | 2/2008 | Kawaguchi et al. | |
| 2008/0122824 A1 * | 5/2008 | Lee | G09G 3/3696 345/211 |

FOREIGN PATENT DOCUMENTS

| | | | |
|---|---|---|---|
| JP | 2001144451 A | 5/2001 | |
| JP | 2003069239 A | 3/2003 | |
| JP | 2003209367 A | 7/2003 | |
| JP | 2003289184 A | 10/2003 | |
| JP | 2003309378 A | 10/2003 | |
| JP | 2007102173 A | 4/2007 | |
| KR | 1020000012919 A | 3/2000 | |
| KR | 100339019 B1 | 5/2002 | |

* cited by examiner

PRINTED CIRCUIT BOARD, DISPLAY APPARATUS HAVING A PRINTED CIRCUIT BOARD AND METHOD OF MANUFACTURING THE PRINTED CIRCUIT BOARD

CROSS REFERENCE TO RELATED APPLICATION

This application is a continuation of U.S. patent application Ser. No. 13/556,274, filed on Jul. 24, 2012, which is a continuation of U.S. patent application Ser. No. 12/204,015, filed on Sep. 4, 2008, which claims priority to Korean Patent Application No. 10-2007-0091958, filed on Sep. 11, 2007, and all the benefits accruing therefrom under 35 USC § 119, the contents of which in its entirety are herein incorporated by reference.

BACKGROUND OF THE INVENTION

1. Field of the Invention

Embodiments of the present invention relate to a printed circuit board ("PCB"), a display apparatus having the PCB and a method of manufacturing the PCB. More particularly, embodiments of the present invention relate to a PCB having reduced noise and used for a display apparatus, a display apparatus having the PCB, and a method of manufacturing the PCB.

2. Description of the Related Art

A printed circuit board ("PCB") generally includes a plurality of components and a plurality of wirings for electrically connecting one component to another component. As electronic technologies are being developed, the speeds of signal transfers among components through the wirings of PCBs are being increased, and the response speeds of the components in the PCBs are also being increased.

An electromagnetic field may be generated around a wiring of a PCB when a current flows through the wiring. Electromagnetic fields generated around adjacent wirings of the PCB may affect the signals transferred through the wirings of the PCB. Therefore, electromagnetic interference ("EMI") caused by the electromagnetic fields of adjacent wirings may interfere with the normal operation of the components of the PCB. The effect of the EMI may be increased as the frequencies of the signals are increased for high-speed operation through the wirings of the PCB.

Signals having high frequencies may be applied to a liquid crystal display ("LCD") apparatus having a large-sized screen display apparatus and displaying images with high quality. In the LCD apparatus, the EMI may be increased because a swing range of a voltage applied to the LCD apparatus is augmented. For example, a signal transferred between a wireless wide area network ("WWAN") and a notebook computer may include considerable noise due to the EMI when the notebook computer is connected to the WWAN.

BRIEF SUMMARY OF THE INVENTION

Embodiments of the present invention provide a printed circuit board ("PCB") capable of reducing noise.

Embodiments of the present invention further provide a display apparatus having the PCB.

Embodiments of the present invention still further provide a method of manufacturing the PCB.

According to exemplary embodiments of the present invention, a PCB includes a first pattern structure, a second pattern structure, a third pattern structure, and a fourth pattern structure. The first pattern structure includes a first ground pattern. The second pattern structure is formed on the first pattern structure. The second pattern structure includes a first line pattern and a second ground pattern. The second ground pattern is electrically insulated from the first line pattern. The third pattern structure is formed on the second pattern structure. The third pattern structure includes a third ground pattern and a second line pattern electrically insulated from the third ground pattern. The fourth pattern structure is formed on the third pattern structure and includes a fourth ground pattern. The first line pattern may be disposed between the first ground pattern and the third ground pattern, and the second line pattern may be disposed between the second ground pattern and the fourth ground pattern.

In exemplary embodiments of the present invention, the PCB may further include a first insulation layer, a second insulation layer and a third insulation layer. The first insulation layer is disposed between the first pattern structure and the second pattern structure. The second insulation layer is disposed between the second pattern structure and the third pattern structure. The third insulation layer is disposed between the third pattern structure and the fourth pattern structure.

In exemplary embodiments of the present invention, the PCB may further include a controller. The controller is electrically connected to the first line pattern and the second line pattern to receive a first differential signal from the first line pattern and apply a second differential signal to the second line pattern.

In exemplary embodiments of the present invention, the PCB may further include a gamma voltage generator. The gamma voltage generator is controlled by the controller to generate a gamma reference voltage. The fourth pattern structure may further include a third line pattern. The third line pattern is electrically insulated from the fourth ground pattern and transfers the gamma reference voltage generated by the gamma voltage generator. The third line pattern may be separated from the second line pattern, such as by not overlapping the second line pattern.

According to other exemplary embodiments of the present invention, a display apparatus includes a display panel and a PCB. The display panel displays an image. The PCB includes a first pattern structure, a second pattern structure, a third pattern structure, and a fourth pattern structure. The first pattern structure includes a first ground pattern. The second pattern structure is formed on the first pattern structure and includes a first line pattern and a second ground pattern electrically insulated from the first line pattern. The third pattern structure is formed on the second pattern structure and includes a third ground pattern and a second line pattern electrically insulated from the third ground pattern. The fourth pattern structure is formed on the third pattern structure and includes a fourth ground pattern. The first line pattern may be disposed between the first ground pattern and the third ground pattern, and the second line pattern may be disposed between the second ground pattern and the fourth ground pattern.

According to still other exemplary embodiments of the present invention, in a method of manufacturing a PCB, a first pattern structure is formed on a first surface of a first insulation substrate. The first pattern structure includes a first ground pattern. Then, a second pattern structure is formed on a second surface of the first insulation substrate opposite to the first surface. The second pattern structure includes a first line pattern overlapping the first ground pattern and a second ground pattern electrically insulated from the first line pattern. Then, a second insulation substrate is disposed on the second pattern structure. Then, a third pattern structure is formed on the second insulation substrate. The third pattern structure includes a second line pattern overlapping the second ground pattern and a third ground pattern electrically insulated from the second line pattern and overlapping the first line pattern. Then, a third insulation substrate is disposed on the third pattern structure. Then, a fourth pattern structure is formed on the third insulation substrate. The fourth pattern structure includes a fourth ground pattern overlapping the second line pattern.

According to yet other exemplary embodiments of the present invention, a method of manufacturing a PCB includes forming a first pattern structure on a first surface of a first insulation substrate, the first pattern structure including a first ground pattern, forming a second pattern structure on a second surface of the first insulation substrate opposite to the first surface, the second pattern structure including a first line pattern overlapping the first ground pattern and a second ground pattern electrically insulated from the first line pattern, forming a third pattern structure on a second insulation layer, the third pattern structure including a second line pattern and a third ground pattern, forming a fourth pattern structure on a fourth insulation substrate, the fourth pattern structure including a fourth ground pattern, disposing the second insulation substrate on the second pattern structure, so that the second line pattern and the third ground pattern respectively overlap the second ground pattern and the first line pattern and the second insulation substrate is interposed between the second pattern structure and the third pattern structure, and disposing the third insulation substrate on the third pattern structure, so that the fourth ground pattern overlaps the second line pattern and the third insulation substrate is interposed between the third pattern structure and the fourth pattern structure.

According to exemplary embodiments of the present invention, signal line patterns are formed in inner pattern structures between outermost pattern structures and ground patterns are formed on and under the signal line patterns. Therefore, noise generated by electromagnetic interference ("EMI") may be prevented.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION OF THE INVENTION

Figure 1:
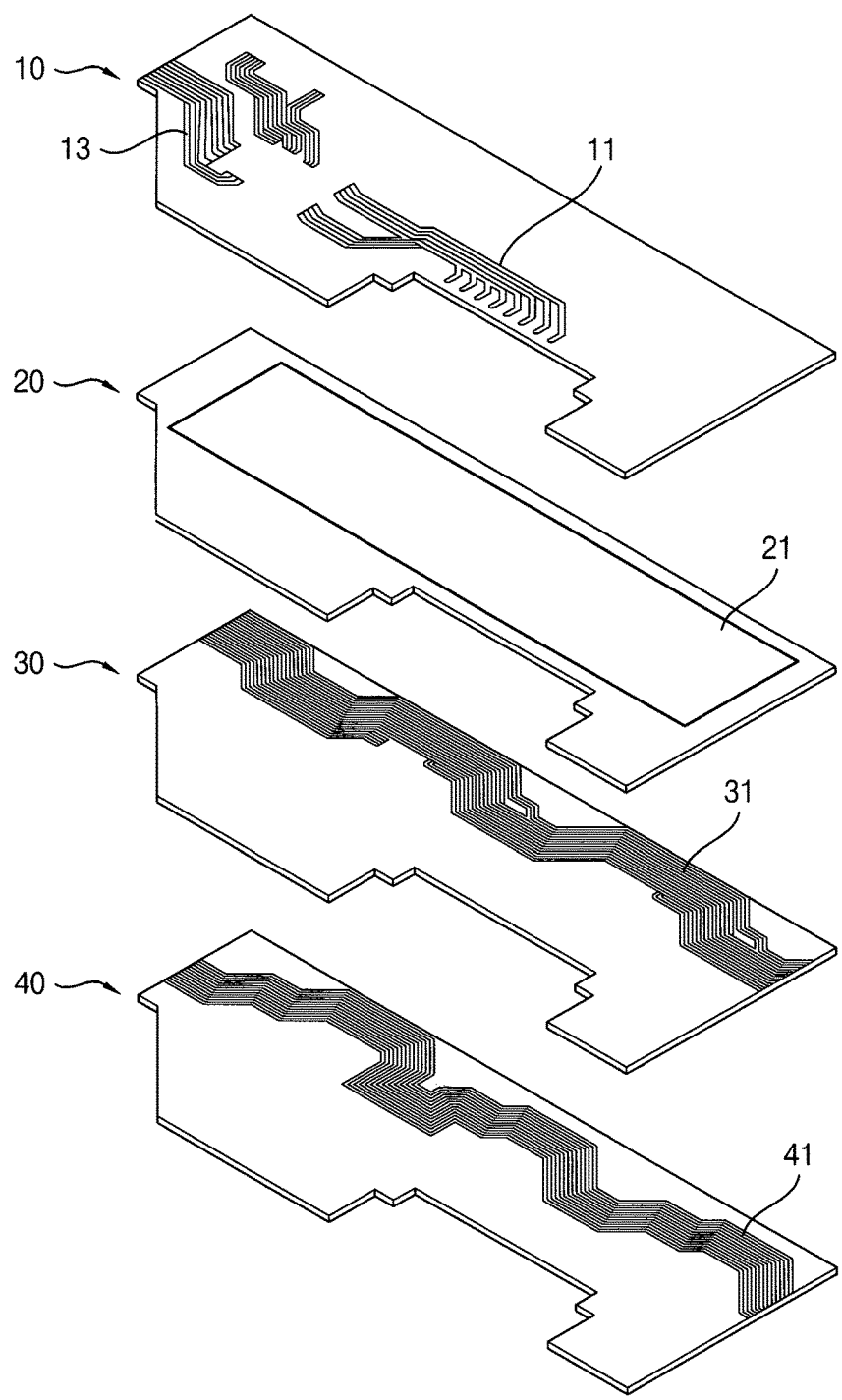
FIG. 1 is an exploded perspective view illustrating an exemplary printed circuit board ("PCB") in accordance with exemplary embodiments of the present invention.

The present invention is described more fully hereinafter with reference to the accompanying drawings, in which embodiments of the present invention are shown. The present invention may, however, be embodied in many different forms and should not be construed as limited to the exemplary embodiments set forth herein. Rather, these exemplary embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, exemplary embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is an exploded perspective view illustrating an exemplary printed circuit board ("PCB") in accordance with exemplary embodiments of the present invention.

Referring to FIG. 1, the PCB includes a first pattern structure 10, a second pattern structure 20, a third pattern structure 30, and a fourth pattern structure 40. The first pattern structure 10 includes a low voltage differential signal ("LVDS") line pattern 11 and a first reduced swing differential signal ("RSDS") line pattern 13. The second pattern structure 20 includes a ground pattern 21, and the third pattern structure 30 includes a gamma line pattern 31. The fourth pattern structure 40 includes a second RSDS line pattern 41.

The ground pattern 21 of the second pattern structure 20 may be located on a portion of the upper face or substantially the entire upper face of the second pattern structure 20. The gamma line pattern 31 of the third pattern structure 30 may partially overlap with the second RSDS line pattern 41 of the fourth pattern structure 40 when the PCB is assembled.

The PCB may further include a controller (not illustrated) and a gamma voltage generator (not illustrated). An image signal applied from an external graphic device (not illustrated) may be transferred to the controller through the LVDS line pattern 11. A control signal applied from the controller may be transferred to a display panel (not illustrated) through the first and the second RSDS line patterns 13 and 41. The gamma voltage generator may be controlled by the controller, and thus a gamma voltage may be generated from the gamma voltage generator. The gamma voltage generated from the gamma voltage generator may be transferred to the display panel through the gamma line pattern 31.

The image signal applied from the external graphic device may be transferred to the controller though the LVDS line pattern 11 of the first pattern structure 10 and the control signal generated from the controller may be transferred to the display panel through the first RSDS line pattern 13. Hence, electromagnetic interference ("EMI") may be generated between the LVDS line pattern 11 and the first RSDS line pattern 13. Further, the LVDS line pattern 11, the first RSDS line pattern 13 and the second RSDS line pattern 41 are located at uppermost and lowermost of portions of the PCB, so that electromagnetic fields may have a great effect on all components of the PCB. For example, the electromagnetic fields may be generated around the LVDS line pattern 11, the first RSDS line pattern 13 and the second RSDS line pattern 41. Furthermore, the gamma line pattern 31 of the third pattern structure 30 partially overlaps with the second RSDS line pattern 41 of the fourth pattern structure 40, so that EMI between the gamma line pattern 31 of the third pattern structure 30 and the second RSDS line pattern 41 of the fourth pattern structure 40 may be generated. As a result, considerable noise may be generated in the above-described PCB according to exemplary embodiments of the present invention.

Figure 2:
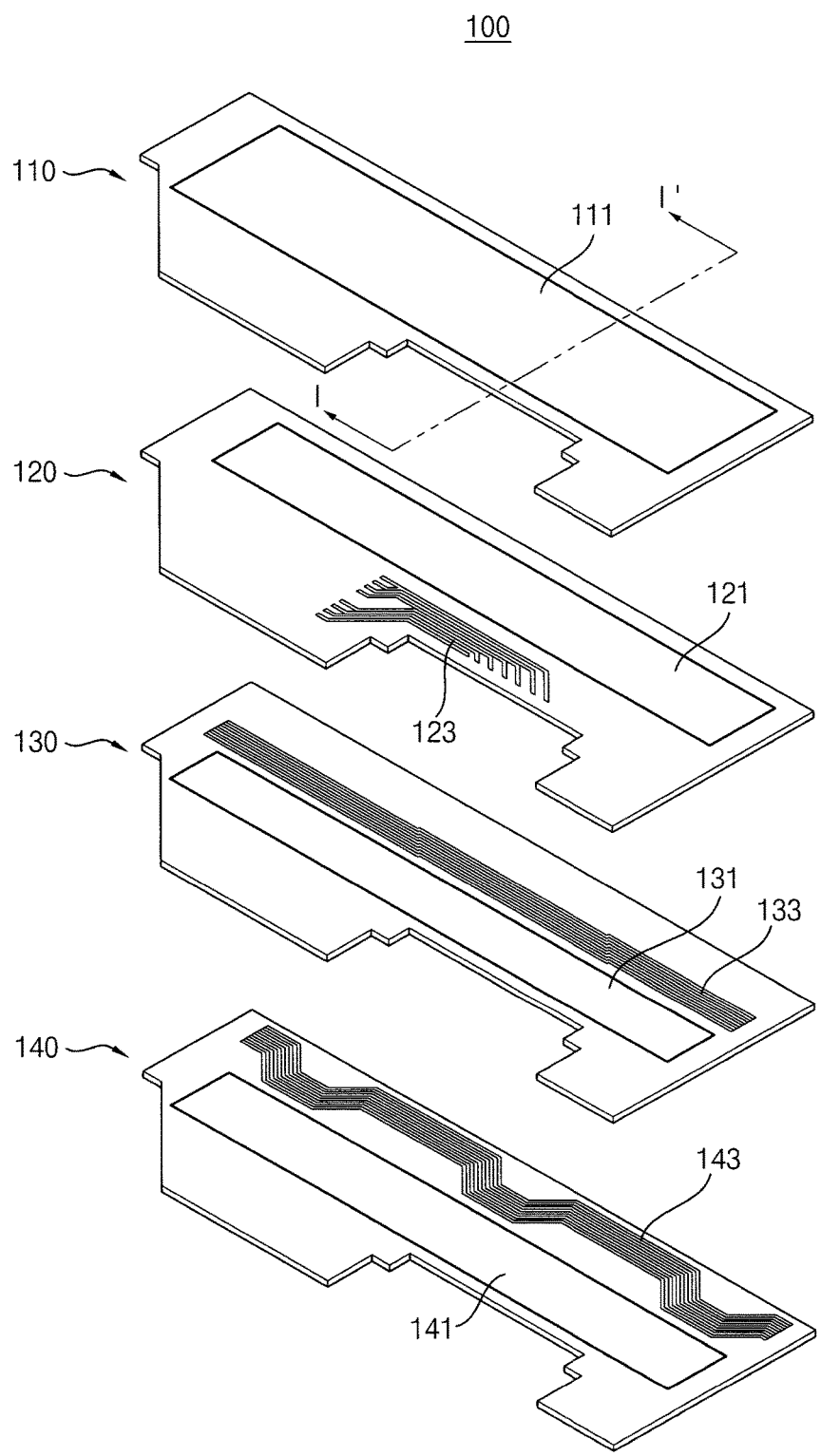
FIG. 2 is an exploded perspective view illustrating an exemplary PCB in accordance with exemplary embodiments of the present invention.
Figure 3:
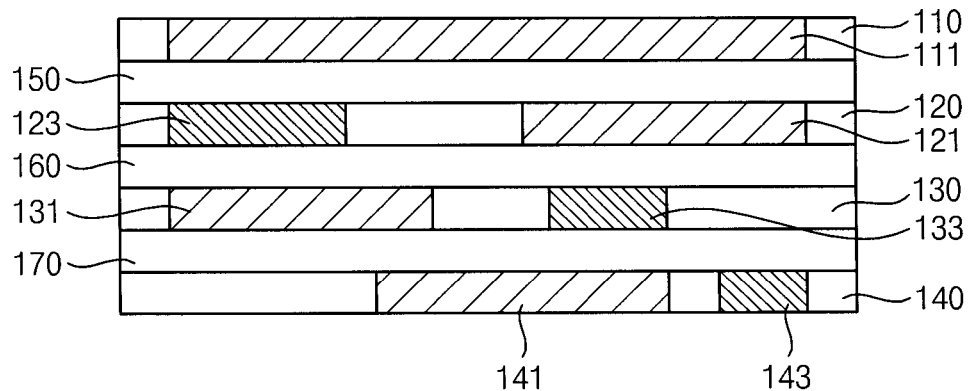
FIG. 3 is a cross-sectional view taken along line I-I' in FIG. 2.
Figure 4:
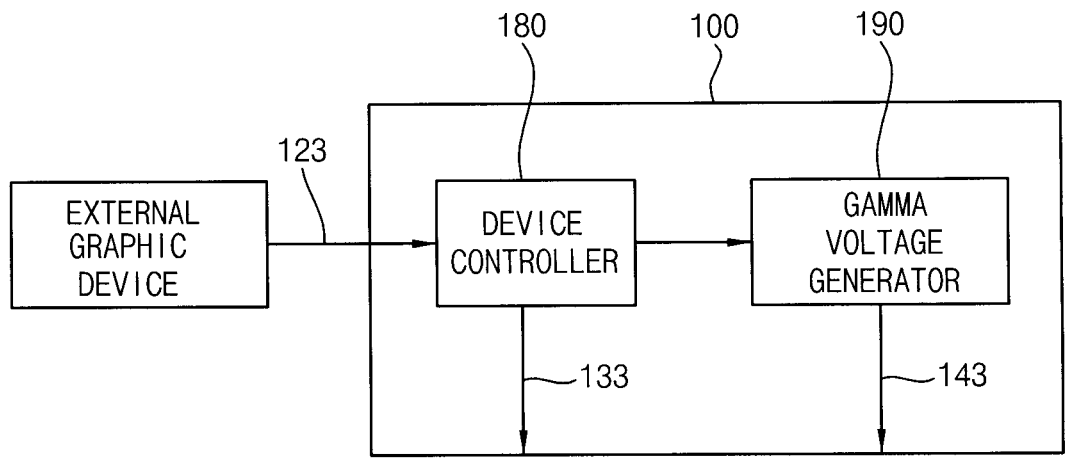
FIG. 4 is a block diagram illustrating an exemplary PCB in accordance with exemplary embodiments of the present invention.

FIG. 2 is an exploded perspective view illustrating an exemplary PCB in accordance with exemplary embodiments of the present invention. FIG. 3 is a cross-sectional view taken along line I-I' illustrated in FIG. 2. FIG. 4 is a block diagram illustrating an exemplary PCB in accordance with exemplary embodiments of the present invention.

Referring to FIGS. 2 to 4, a PCB 100 includes a first pattern structure 110, a second pattern structure 120, a third pattern structure 130, and a fourth pattern structure 140. The first to fourth pattern structures 110, 120, 130, and 140 may be formed from conductive layers including a conductive material, respectively.

The first pattern structure 110 includes a first ground pattern 111. The first pattern structure 110 may have a plate shape. In an exemplary embodiment of the present invention, the first pattern structure 110 may have a plate shape having a first long side, a second long side opposite to the first long side and two short sides connecting the first long side with the second long side, and the first long side may have a stepped cut portion, an inclined portion and a straight portion connecting the stepped cut portion to the inclined portion. The stepped portion may provide a space at which components of a liquid crystal display ("LCD") apparatus employing the PCB 100 are located. In another exemplary embodiment of the present invention, the first long side of the first pattern structure 110 may include an inclined portion and two straight portions respectively extended from both ends of the inclined portion. While particular peripheries have been described for the first pattern structure 110, it should be understood that alternate peripheries would also be within the scope of these embodiments for accommodating the needs of the apparatuses in which the PCB 100 is employed. The first ground pattern 111 may be located on a portion of the upper face or substantially the entire upper face of the first pattern structure 110 except for an edge portion of the first pattern structure 110. For example, when the first long side of the first pattern structure 110 includes the stepped cut portion, the inclined portion and the straight portion, the first ground pattern 111 may have a rectangular plate form having a width that is smaller than a minimum distance between the first and the second long sides.

The second pattern structure 120 is disposed under the first pattern structure 110, such that the first pattern structure 110 overlaps the second pattern structure 120. The second pattern structure 120 has a shape substantially the same as or similar to that of the first pattern structure 110. Thus, any repetitive explanation concerning the shape of the second pattern structure 120 will be omitted. The second pattern structure 120 includes a first line pattern 123 and a second ground pattern 121. The first line pattern 123 of the second pattern structure 120 is disposed under the first ground pattern 111 of the first pattern structure 110 when the PCB 100 is assembled. A first differential signal is transferred through the first line pattern 123. For example, the first differential signal may be transferred from an external graphic device to a controller of the PCB 100 through the first line pattern 123. The first line pattern 123 may be variously extended on the second pattern structure 120. For example, the first line pattern 123 may have a first line portion extended in a first direction and a second line portion extended from an end of the first line portion in a second direction that is different from the first direction. The second ground pattern 121 is electrically insulated from the first line pattern 123. For example, when the first long side of the second pattern structure 120 includes the stepped cut portion, the inclined portion and the straight portion as previously described with respect to the first pattern structure 110, the second ground pattern 121 may be adjacent to the second long side of the second pattern structure 120 and the first line pattern 123 may be closer to the first long side of the second pattern structure 120 and separated from the second ground pattern 121.

The third pattern structure 130 is disposed under the second pattern structure 120, such that the second pattern structure 120 overlaps the third pattern structure 130. The third pattern structure 130 has a shape substantially the same as or similar to that of the first pattern structure 110. Thus, any repetitive explanation concerning the shape of the third pattern structure 130 will be omitted. The third pattern structure 130 includes a third ground pattern 131 and a second line pattern 133. The third ground pattern 131 is disposed under the first line pattern 123 when the PCB 100 is assembled. The second line pattern 133 is electrically insulated from the third ground pattern 131 and is disposed under the second ground pattern 121 when the PCB 100 is assembled. A second differential signal is transferred through the second line pattern 133. For example, the second differential signal is transferred from the controller of the PCB 100 to a display panel through the second line pattern 133. The second line pattern 133 may be variously extended. For example, the second line pattern 133 may be extended in one direction, such as substantially parallel to the second long side of the third pattern structure 130. The second line pattern 133 may not overlap with the first line pattern 123.

The fourth pattern structure 140 is disposed under the third pattern structure 130, such that the third pattern structure 130 overlaps the fourth pattern structure 140. The fourth pattern structure 140 has a shape substantially the same as or similar to that of the first pattern structure 110. Thus, any repetitive explanation concerning the shape of the fourth pattern structure 140 will be omitted. The fourth pattern structure 140 includes a fourth ground pattern 141 and a third line pattern 143. The fourth ground pattern 141 of the fourth pattern structure 140 is disposed under the second line pattern 133 of the third pattern structure 130 in an assembled condition of the PCB 100. The third line pattern 143 of the fourth pattern structure 140 may not overlap with the second line pattern 133 of the third pattern structure 130. The second line pattern 133 may be spaced from the second long side of the third pattern structure 130 so as to overlap the fourth ground pattern 141, but not overlap the third line pattern 143. For example, the third line pattern 143 may be separated from the fourth ground pattern 141, such that the second line pattern 133 of the third pattern structure 130 is disposed on a region between the third line pattern 143 of the fourth pattern structure 140 and the fourth ground pattern 141 of the fourth pattern structure 140. The third line pattern 143 is electrically insulated from the fourth ground pattern 141. The third line pattern 143 may be overlapped by the second ground pattern 121 of the second pattern structure 120 and the first ground pattern 111 of the first pattern structure 110.

The PCB 100 may further include a first insulation layer 150, a second insulation layer 160 and a third insulation layer 170. The first to third insulation layers 150, 160 and 170 may have a shape substantially the same as or similar to that of the first pattern structure 110. The first insulation layer 150 is disposed between the first pattern structure 110 and the second pattern structure 120 to electrically insulate the first pattern structure 110 and the second pattern structure 120 from each other. The second insulation layer 160 is disposed between the second pattern structure 120 and the third pattern structure 130 to electrically insulate the second pattern structure 120 and the third pattern structure 130 from each other. The third insulation layer 170 is disposed between the third pattern structure 130 and the fourth pattern structure 140 to electrically insulate the third pattern structure 130 and the fourth pattern structure 140 from each other.

The PCB 100 may further include a device controller 180 electrically connected to the first line pattern 123 and the second line pattern 133. The device controller 180 receives the first differential signal from the external graphic device via the first line pattern 123 and applies the second differential signals to the second line pattern 133. Also, the PCB 100 may further include a gamma voltage generator 190 which is controlled by the controller 180 to generate a gamma voltage to be applied to the third line pattern 143.

In exemplary embodiments of the present invention, the PCB 100 receives an original image signal from an external graphic device and applies an image signal and a control signal to a display panel.

The original image signal may be differentially applied to the PCB 100 by a low voltage differential signaling ("LVDS") method. The first differential signal includes a differential signal form of the original image signal. The first differential signal is transferred from the external graphic device to the controller 180 through the first line pattern 123. The controller 180 processes the first differential signal to generate an image signal. The controller 180 also generates a control signal for controlling the display panel. The image signal and the control signal may be differentially applied to the display panel by a reduced swing differential signaling ("RSDS") method. For example, the controller 180 applies the second differential signal, which includes differential signal forms of the image signal and/or the control signal, to the second line pattern 133, and the second differential signal is transferred from the controller 180 to the display panel through the second line pattern 133. A frequency of the first differential signal may be the same as that of the second differential signal when the PCB 100 receives the first differential signal from the external graphic device by the LVDS method and applies the second differential signal to the display panel by the RSDS method.

In another exemplary embodiment of the present invention, the PCB 100 may receive the first differential signal from the external graphic device by the LVDS method and apply the second differential signal to the display panel by a min-LVDS method. A frequency of the first differential signal may be different from that of the second differential signal when the PCB 100 receives the first differential signal from the external graphic device by the LVDS method and then applies the second differential signal to the display panel by the min-LVDS method.

The gamma voltage generator 190 is controlled by the control signal of the controller 180 to generate the gamma voltage. The gamma voltage generated from the gamma voltage generator 190 is transferred from the gamma voltage generator 190 to the display panel through the third line pattern 143.

The electromagnetic fields generated around the second line pattern 133 and the third line pattern 143, which are generated by signals passing therethrough, may interfere with each other if the second line pattern 133 overlaps with the third line pattern 143. Thus, according to exemplary embodiments of the present invention, an area in which the second line pattern 133 overlaps with the third line pattern 143 may be minimized to decrease the EMI between the electromagnetic fields around the second line pattern 133 and the third line pattern 143. In exemplary embodiments of the present invention, when the second line pattern 133 and the third line pattern 143 are viewed from a plan view, the second line pattern 133 may be separated from the third line pattern 143. Also, the second line pattern 133 may be extended in one direction, such as substantially parallel to the second long side of the third pattern structure 130, to minimize the area in which the second line pattern 133 overlaps with the third line pattern 143.

In the PCB 100 according to exemplary embodiments of the present invention, the first line pattern 123 and the second line pattern 133 are respectively formed from different layers and ground patterns are formed on and under each of the first line pattern 123 and the second line pattern 133. For example, first ground pattern 111 is formed on the first line pattern 123 and third ground pattern 131 is formed under the first line pattern 123. Similarly, second ground pattern 121 is formed on second line pattern 133 and fourth ground pattern 141 is formed under second line pattern 133. Therefore, the EMI between the first line pattern 123 and the second line pattern 133 may be prevented. Also, the second line pattern 133 does not overlap with the third line pattern 143 to prevent the EMI between the second line pattern 133 and the third line pattern 143. In addition, the first line pattern 123 and the second line pattern 133 are formed from inner layers of the PCB 100 which are disposed between outermost layers of the PCB 100, so that the electromagnetic fields generated around the first line pattern 123 and the second line pattern 133 may not have an effect on other components of the PCB 100. Therefore, the PCB 100 according to exemplary embodiments of the present invention may decrease noise.

Figure 5A:
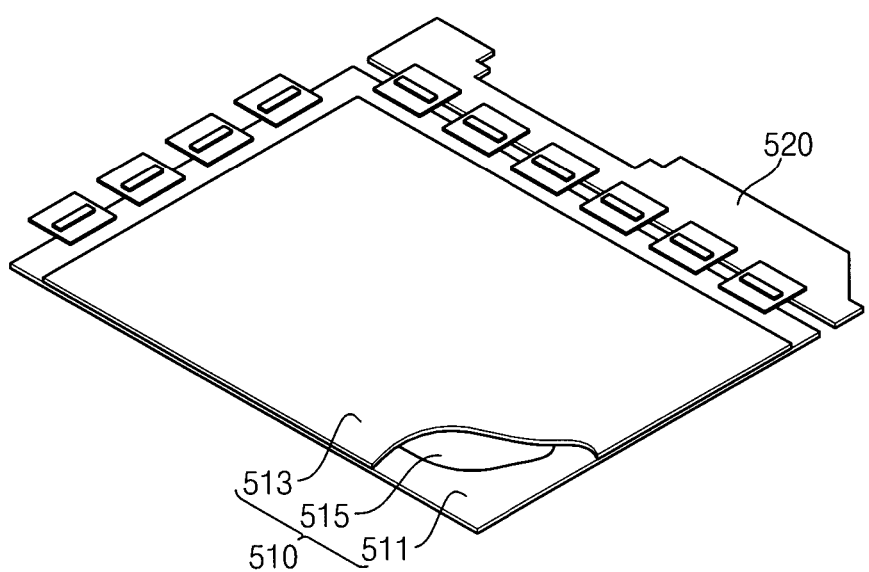
FIG. 5A is a perspective view illustrating an exemplary display apparatus in accordance with exemplary embodiments of the present invention.
Figure 5B:
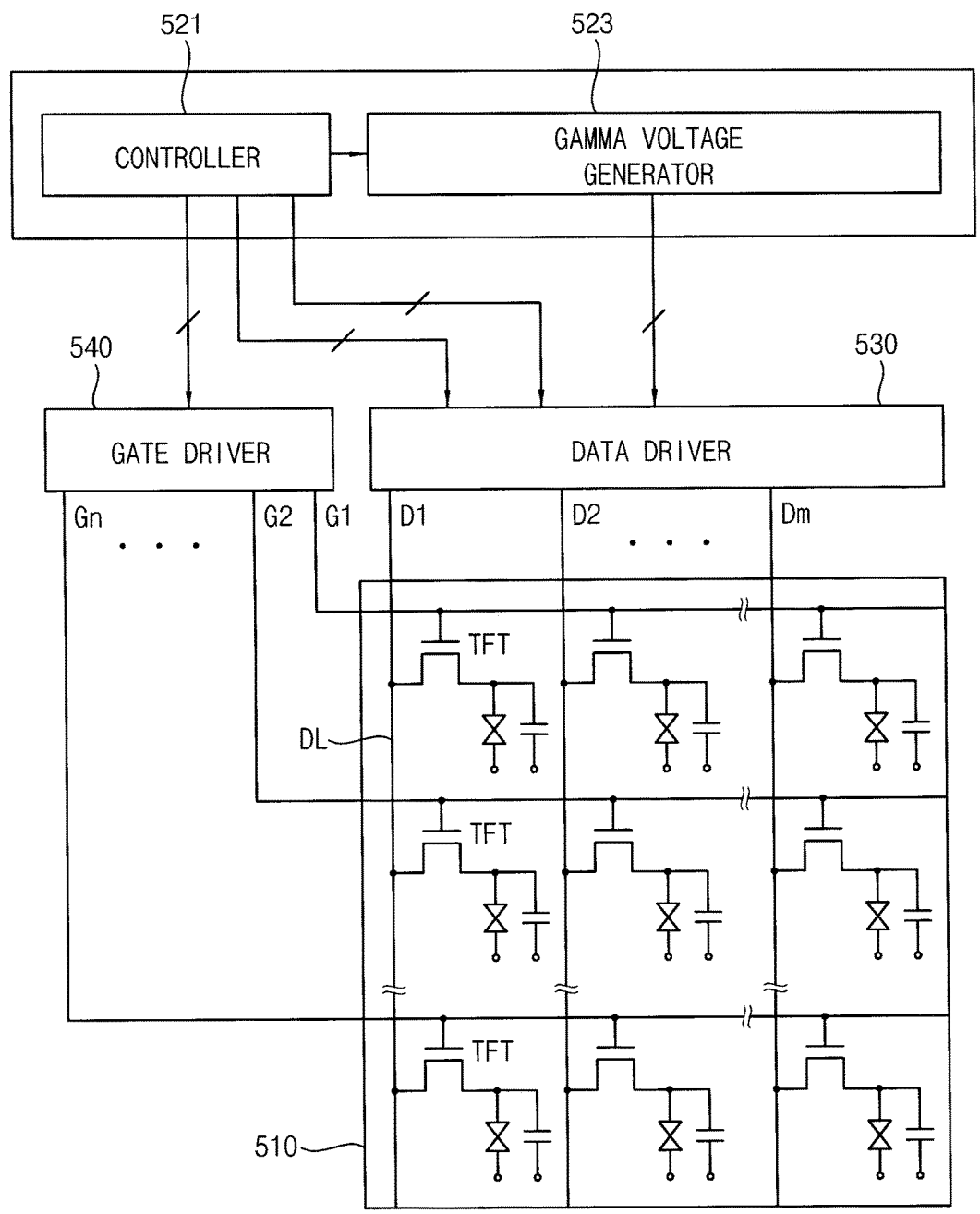
FIG. 5B is a block diagram illustrating an exemplary display apparatus in accordance with exemplary embodiments of the present invention.

FIG. 5A is a perspective view illustrating an exemplary display apparatus in accordance with exemplary embodiments of the present invention. FIG. 5B is a block diagram illustrating an exemplary display apparatus in accordance with exemplary embodiments of the present invention. The PCB shown in FIGS. 5A and 5B is substantially the same as or similar to the PCB illustrated in and described with respect to FIGS. 2 to 4. Thus, any repetitive explanation concerning the PCB will be omitted.

Referring to FIGS. 5A and 5B, a display apparatus 500 includes a display panel 510 and a PCB 520.

The display panel 510 includes a first substrate 511, a second substrate 513 and a liquid crystal layer 515.

The first substrate 511 may include a plurality of gate lines $G_1, \ldots, G_n$ (n is a positive integer greater than 1) and a plurality of data lines $D_1, \ldots, D_m$ (m is a positive integer greater than 1). The data lines $D_1, \ldots, D_m$ are electrically insulated from the gate lines G1, ..., $G_n$ and cross the gate lines $G_1, \ldots, G_n$. The first substrate 511 may further include a plurality of pixels for displaying images. A switching element TFT, such as a thin film transistor ("TFT"), and a pixel electrode (not illustrated) are formed in each of the pixels.

The second substrate 513 may include a color filter layer (not shown) and a common electrode (not shown) formed on the color filter layer.

The liquid crystal layer 515 is disposed between the first substrate 511 and the second substrate 513. The liquid crystal layer 515 includes liquid crystal molecules. The arrangement of the liquid crystal molecules is changed by an electric field generated between the pixel electrode of the first substrate 511 and the common electrode of the second substrate 513, so that an amount of light passing through the liquid crystal layer 515 may be controlled.

The display apparatus 500 may further include a gate driver 540 and a data driver 530. The gate driver 540 is controlled by the controller 521 to apply a gate driving signal to the gate lines $G_1, \ldots, G_n$. The data driver 530 is controlled by the controller 521 to apply an image signal to the data lines $D_1, \ldots$, Dm.

The data driver 530 applies the image signal to the data lines $D_1, \ldots, D_m$ in response to output signals from the controller 521 and the gamma voltage generator 523. The image signal applied to the data lines $D_1, \ldots, D_m$ is applied to the pixel electrode via the switching element TFT when the switching element TFT is turned on. The switching element TFT is turned on when the gate signal is applied to the gate lines $G_1, \ldots, G_n$.

FIGS. 6A to 6E are cross-sectional views illustrating an exemplary method of manufacturing an exemplary PCB in accordance with exemplary embodiments of the present invention.

Figure 6A:
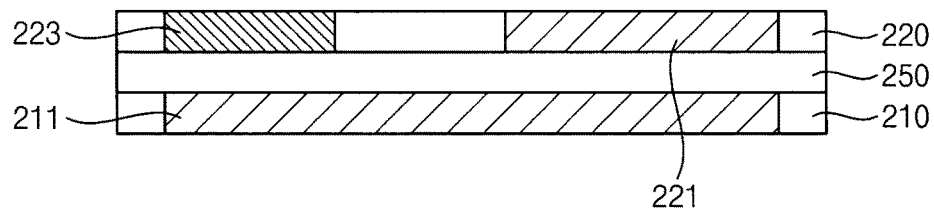
FIGS. 6A to 6E are cross-sectional views illustrating an exemplary method of manufacturing an exemplary PCB in accordance with exemplary embodiments of the present invention.

Referring to FIG. 6A, a first pattern structure 210 is formed on a lower surface of a first insulation substrate 250 and a second pattern structure 220 is formed on an upper surface of the first insulation substrate 250 opposite to the lower surface. The first pattern structure 210 includes a first ground pattern 211. The second pattern structure 220 includes a first line pattern 223 and a second ground pattern 221. The first line pattern 223 is formed above the first ground pattern 211, so as to overlap with the first ground pattern 211. The second ground pattern 221 is electrically insulated from the first line pattern 223, such as by being spaced and separated from the first line pattern 223. The first insulation substrate 250 electrically insulates the first pattern structure 210 and second pattern structure 220 from each other.

Figure 6B:
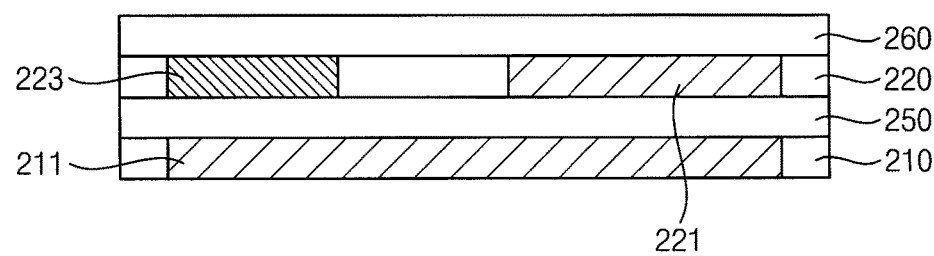

Referring to FIG. 6B, a second insulation substrate 260 is disposed on the second pattern structure 220, such that a lower surface of the second insulation substrate 260 faces the second pattern structure 220.

Figure 6C:
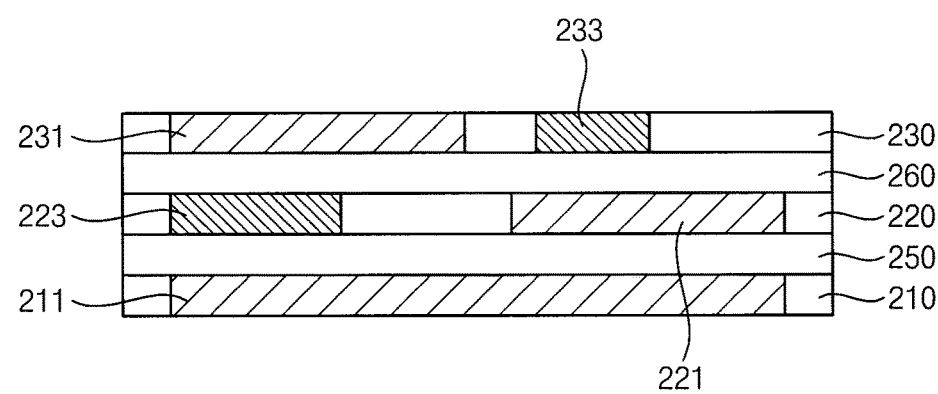

Referring to FIG. 6C, a third pattern structure 230 is formed on an upper surface of the second insulation substrate 260, where the upper surface is opposite to the lower surface of the second insulation substrate 260. The third pattern structure 230 includes a second line pattern 233 and a third ground pattern 231. The second line pattern 233 overlaps with the second ground pattern 221. The third ground pattern 231 is electrically insulated from the second line pattern 233, such as by being spaced and separated from the second line pattern 233, and overlaps with the first line pattern 223. The second insulation substrate 260 electrically insulates the second pattern structure 220 and the third pattern structure 230 from each other.

Figure 6D:
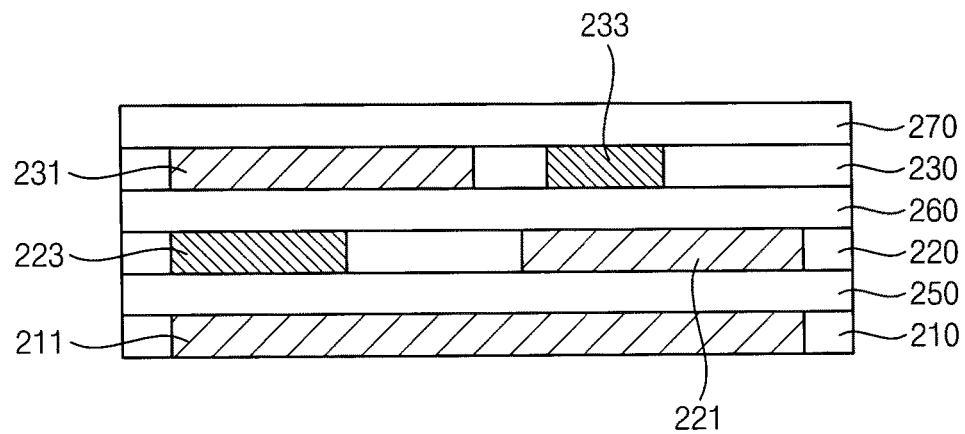

Referring to FIG. 6D, a third insulation substrate 270 is disposed on the third pattern structure 230, such that a lower surface of the third insulation substrate 270 faces the third pattern structure 230.

Figure 6E:
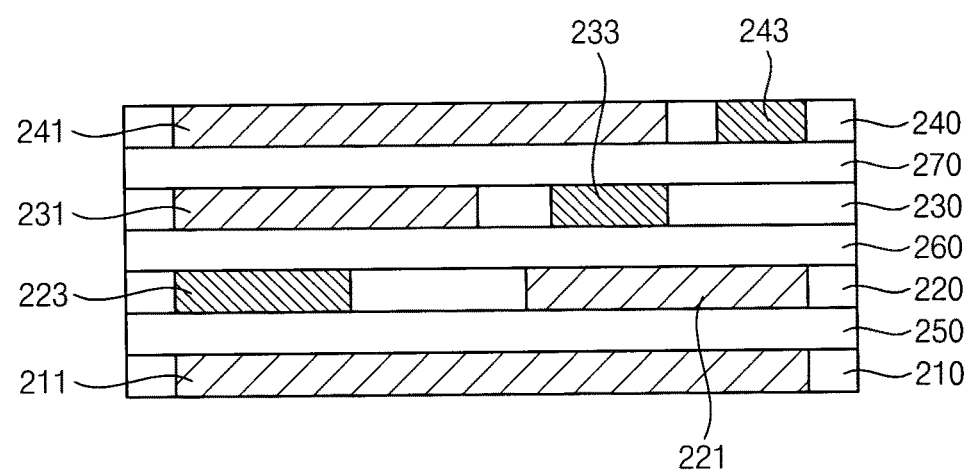

Referring to FIG. 6E, a fourth pattern structure 240 is formed on an upper surface of the third insulation substrate 270, where the upper surface is opposite to the lower surface of the third insulation substrate 270. The fourth pattern structure 240 includes a fourth ground pattern 241 and may further include a third line pattern 243. The fourth ground pattern 241 covers the second line pattern 233, such as by overlapping with the second line pattern 233. The third insulation substrate 270 electrically insulates the third pattern structure 230 and the fourth pattern structure 240 from each other. If provided, the third line pattern 243 overlaps an area of the third pattern structure 230 where the second line pattern 233 is not formed.

Although not shown, a fourth insulation substrate may be formed on the fourth pattern structure 240. Also, the first to fourth insulation substrates 250, 260, 270 may also be termed insulation layers.

A controller (not illustrated) may be further formed on one of the first to fourth insulation substrates 250, 260, 270. The controller may be electrically connected to the first line pattern 223 and the second line pattern 233. An original image signal provided by an external graphic device (not illustrated) is transferred from the external graphic device to the controller through the first line pattern 223. The controller generates an image signal and a control signal in response to the original image signal. The image signal and the control signal generated from the controller are transferred from the controller to a display panel through the second line pattern 233.

As described above, the fourth pattern structure 240 may further include the third line pattern 243. Also, a gamma voltage generator (not illustrated) may be further formed on one of the first to fourth insulation substrates 250, 260, 270. The gamma voltage generator may be electrically connected to the third line pattern 243.

When viewed from a plan view, the third line pattern 243 may be separated from the second line pattern 233, so that the electromagnetic fields around the second line pattern 233 and the third line pattern 243 may not interfere with each other.

FIGS. 7A to 7D are cross-sectional views illustrating an exemplary method of manufacturing an exemplary PCB in accordance with exemplary embodiments of the present invention.

Figure 7A:
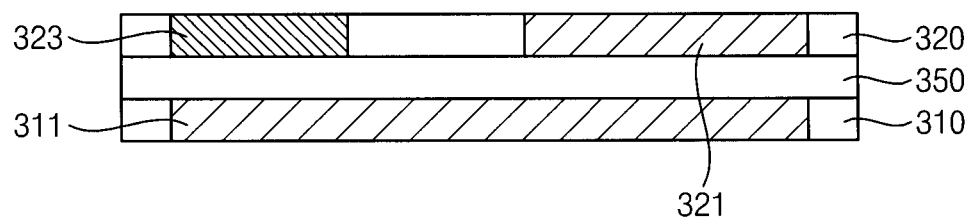
FIGS. 7A to 7D are cross-sectional views illustrating an exemplary method of manufacturing an exemplary PCB in accordance with exemplary embodiments of the present invention.

Referring to FIG. 7A, a first pattern structure 310 is formed on a lower surface of the first insulation substrate 350 and a second pattern structure 320 is formed on an upper surface of the first insulation substrate 350 opposite to the lower surface. The first pattern structure 310 includes a first ground pattern 311. The second pattern structure 320 includes a first line pattern 323 and the second ground pattern 321. The first line pattern 323 is formed above the first ground pattern 311, so as to overlap with the first ground pattern 311. The second ground pattern 321 is electrically insulated from the first line pattern 323, such as being spaced and separated from the first line pattern 323.

Figure 7B:
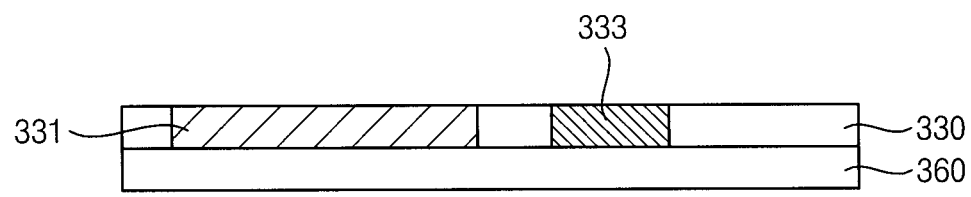

Referring to FIG. 7B, a third pattern structure 330 is formed on a second insulation substrate 360. The third pattern structure 330 includes a second line pattern 333 and a third ground pattern 331.

Figure 7C:
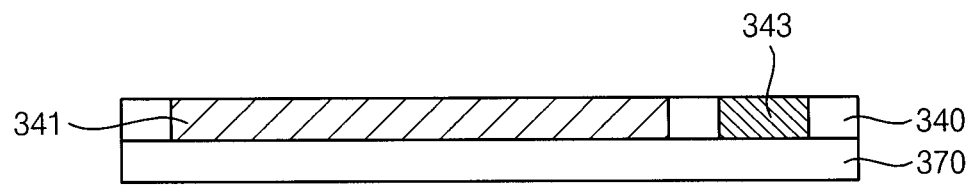

Referring to FIG. 7C, a fourth pattern structure 340 is formed on a third insulation substrate 370. The fourth pattern structure 340 includes a fourth ground pattern 341. The fourth pattern structure 340 may further include a third line pattern 343.

Figure 7D:
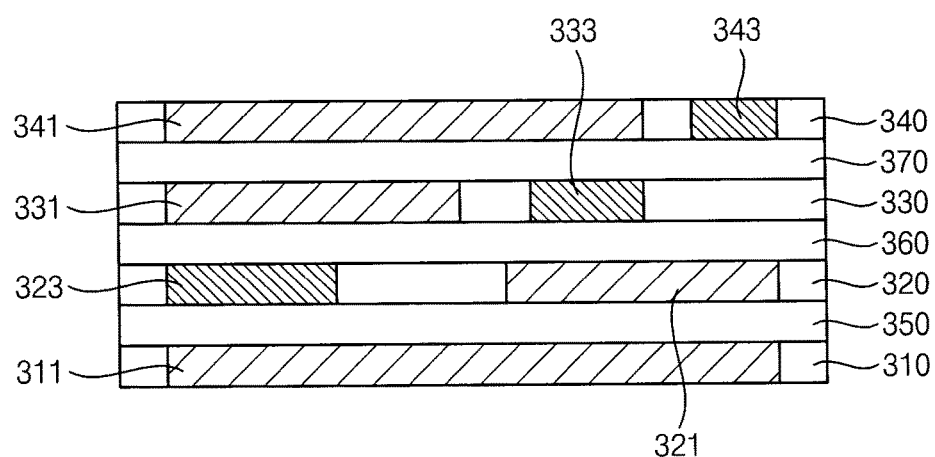

Referring to FIG. 7D, the second insulation substrate 360 having the second line pattern 333 and the third ground pattern 331 formed thereon is disposed on the second pattern structure 320, so that the second line pattern 333 and the third ground pattern 331 are respectively located above the second ground pattern 321 and the first line pattern 323.

Then, the third insulation substrate 370 having the fourth ground pattern 341 formed thereon is disposed on the third pattern structure 330, so that the fourth ground pattern 341 is disposed above the second line pattern 333. When the fourth pattern structure 340 includes the third line pattern 343, the third line pattern 343 is arranged such that it does not overlap with the second line pattern 333.

According to the present invention, signal line patterns are formed in inner pattern structures of the PCB between outermost pattern structures of the PCB and ground patterns are formed on and under the signal line patterns. Therefore, noise generated by EMI may be prevented.

Also, output line patterns of a controller may not overlap with gamma line patterns so that the noise may be further prevented.

The foregoing is illustrative of the present invention and is not to be construed as limiting thereof Although a few exemplary embodiments of the present invention have been described, those skilled in the art will readily appreciate that many modifications are possible in the exemplary embodiments without materially departing from the novel teachings and advantages of this invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A printed circuit board comprising:
a first pattern structure including a first ground pattern;
a second pattern structure on the first pattern structure, the second pattern structure including:
   a first line pattern overlapping the first ground pattern; and
   a second ground pattern electrically insulated from the first line pattern;
a third pattern structure on the second pattern structure, the third pattern structure including:
   a second line pattern overlapping the second ground pattern; and
   a third ground pattern electrically insulated from the second line pattern and overlapping the first line pattern; and
a fourth pattern structure on the third pattern structure, the fourth pattern structure including:

a fourth ground pattern overlapping the second line pattern; and a third line pattern electrically insulated from the fourth ground pattern, wherein the first line pattern is not overlapped by and is not superimposed with any portion of the third line pattern in a plan view.

2. The printed circuit board of claim 1, wherein the third line pattern does not overlap both the first line pattern and the second line pattern.

3. The printed circuit board of claim 2, wherein the third line pattern overlaps the second ground pattern.

4. The printed circuit board of claim 2, wherein the third line pattern does not overlap the third ground pattern.

5. The printed circuit board of claim 1, wherein the fourth ground pattern overlaps both the first line pattern and the second line pattern.

6. The printed circuit board of claim 5, wherein the fourth ground pattern overlaps the third ground pattern.

7. The printed circuit board of claim 1, further comprising:

a controller electrically connected to the first line pattern and the second line pattern, wherein the controller receives a first differential signal from the first line pattern and applies a second differential signal to the second line pattern.

8. The printed circuit board of claim 7, further comprising:

a gamma voltage generator controlled by the controller to generate a gamma reference voltage, wherein the third line pattern transfers the gamma reference voltage generated by the gamma voltage generator.

* * * * *